US008363503B2

(12) United States Patent
Sato et al.

(10) Patent No.: US 8,363,503 B2
(45) Date of Patent: Jan. 29, 2013

(54) SEMICONDUCTOR MEMORY DEVICE, MEMORY CONTROLLER THAT CONTROLS THE SAME, AND INFORMATION PROCESSING SYSTEM

(75) Inventors: Takenori Sato, Chuo-ku (JP); Hiroki Fujisawa, Chou-ku (JP)

(73) Assignee: Elpida Memory, Inc., Tokyo (JP)

( * ) Notice: Subject to any disclaimer, the term of this patent is extended or adjusted under 35 U.S.C. 154(b) by 339 days.

(21) Appl. No.: 12/776,964

(22) Filed: May 10, 2010

(65) Prior Publication Data

US 2010/0302893 A1    Dec. 2, 2010

(30) Foreign Application Priority Data

May 29, 2009    (JP) .................................. 2009-131468

(51) Int. Cl.
*G11C 7/00*    (2006.01)
(52) U.S. Cl. ................. 365/227; 365/189.17; 365/233.1
(58) Field of Classification Search .................. 365/227, 365/189.17, 233.1
See application file for complete search history.

(56) References Cited

U.S. PATENT DOCUMENTS

| 2003/0179613 A1* | 9/2003 | Iwamoto ....................... 365/194 |
| 2007/0091705 A1* | 4/2007 | Hayashi ........................ 365/222 |
| 2007/0188206 A1* | 8/2007 | Lee ............................... 327/158 |
| 2007/0279111 A1* | 12/2007 | Maeda et al. ................. 327/158 |

OTHER PUBLICATIONS

"JEDEC Standard, DDR3 SDRAM Specification, JESD79-3B (Revision of JESD79-3A, Sep. 2007)", JEDEC Solid State Technology Association, Apr. 2008, 200 pgs.

* cited by examiner

*Primary Examiner* — Hoai V Ho
(74) *Attorney, Agent, or Firm* — Sughrue Mion, PLLC (57) ABSTRACT

To include a power-down control circuit that suspends an operation of a predetermined internal circuit in response to a power-down command, and an external terminal to which a selection signal is input from outside simultaneously with issuance of a power-down command. The power-down control circuit suspends an operation of a DLL circuit when the selection signal is at a low level, and continues an operation of the DLL circuit when the selection signal is at a high level. According to the present invention, by using the selection signal input simultaneously with a power-down command, mode selection can be made on-the-fly.

20 Claims, 8 Drawing Sheets

FIG.8

SEMICONDUCTOR MEMORY DEVICE, MEMORY CONTROLLER THAT CONTROLS THE SAME, AND INFORMATION PROCESSING SYSTEM

BACKGROUND OF THE INVENTION

1. Field of the Invention

The present invention relates to a semiconductor memory device and a memory controller that controls the same, and more particularly relates to a semiconductor memory device capable of entering in a power-down mode and a memory controller that controls the same. The present invention also relates to an information processing system including the semiconductor memory device and the memory controller.

2. Description of Related Art

For a semiconductor memory device represented by DRAM (Dynamic Random Access Memory), there is often prepared a power-down mode to reduce the current consumption of the device during a non-access time. For example, for a DDR3 (Double Data Rate 3) DRAM, a mode called a precharge power-down mode is prepared. The precharge power-down mode is a mode in which operations of several internal circuits are suspended in a state that all banks are precharged, and thus the current consumption during a non-access time is reduced.

The precharge power-down mode includes a fast exit mode and a slow exit mode (see JEDEC STANDARD, DDR3 SDRAM Specification, JESD79-3B (Revision of JESD79-3A, September 2007), April 2008, JEDEC SOLID STATE TECHNOLOGY ASSOCIATION <URL:http://www.jedec.org/download/search/JESD79-3B.pdf>).

The fast exit mode is a mode in which an operation of a DLL (Delay Locked Loop) circuit is continuously activated even when the circuit is in the precharge power-down mode. When the fast exit mode is selected, although there is some current consumption by the DLL circuit, it is possible to return (exit) from the precharge power-down mode immediately. Therefore, the fast exit mode is preferable when frequently entering and returning of the circuit in and from the precharge power-down mode are repeated. Further, even in the precharge power-down mode, an ODT (On Die Termination) operation can be used in a synchronization mode, and thus it is possible to access to other Ranks with which a data input/output terminal is shared, in a usual manner and at a high speed.

On the other hand, the slow exit mode is a mode in which an operation of a DLL circuit is suspended when the circuit is in the precharge power-down mode. When the slow exit mode is selected, due to suspension of the DLL circuit, it is possible to minimize its current consumption. However, because the DLL circuit is suspended, the time required to return from the precharge power-down mode is longer, and at the same time, the ODT operation becomes non-synchronous in the precharge power-down mode. These factors reduce the speed for accessing other Ranks with which a data input/output terminal is shared.

As described above, the fast exit mode and the slow exit mode have their advantages and disadvantages. Whether to use either the fast exit mode or the slow exit mode is determined depending on a set value of a mode register. Conventionally, selection of these modes is made by using a mode-register set operation performed after inputting power.

Whether to use either the fast exit mode or the slow exit mode is determined depending on a set value of a mode register. Therefore, it is not practical to switch the modes as needed during a practical use. That is, to change the set value of the mode register, it is necessary to execute a mode register set (MRS) command, and after the MRS command is executed, it is not possible to input another command unless a predetermined time (tMOD) is elapsed. Therefore, there is a problem that when switching of the modes is frequently performed, an overhead becomes large.

Due to these circumstances, either one of the fast exit mode and the slow exit mode is selected after inputting power according to its system characteristics, and accordingly it has been rare to change the selected mode at the practical use. Therefore, there is another problem that, when the fast exit mode is selected, the fast exit mode is always used thereafter, and accordingly the current consumption becomes large, whereas when the slow exit mode is selected, the slow exit mode is always used thereafter, and accordingly the performance of the system is degraded.

SUMMARY OF THE INVENTION

In one embodiment, there is provided a semiconductor memory device that includes: a memory cell array that includes a plurality of memory cells; an output buffer that outputs read data read from the memory cell array to outside; a DLL circuit that controls an operation timing of the output buffer; a power-down control circuit that suspends an operation of a predetermined internal circuit in response to issuance of a power-down command from outside; and an external terminal to which a selection signal is input from outside simultaneously with issuance of the power-down command, wherein the power-down control circuit suspends an operation of the DLL circuit when the selection signal indicates a first state and continues an operation of the DLL circuit when the selection signal indicates a second state.

In another embodiment, there is provided a memory controller that controls a semiconductor memory device capable of entering in a power-down mode, the memory controller including: a first output terminal that outputs a power-down command used for causing the semiconductor memory device to enter in the power-down mode; a second output terminal that outputs a selection signal; and a control circuit that changes the selection signal to a first state simultaneously with an output of the power-down command when a DLL circuit included in the semiconductor memory device is suspended in the power-down mode, and changes the selection signal to a second state simultaneously with an output of the power-down command when the DLL circuit is operated in the power-down mode.

In still another embodiment, there is provided an information processing system that includes: a semiconductor memory device; and a memory controller that controls the semiconductor memory device, wherein the semiconductor memory device comprises: a memory cell array that includes a plurality of memory cells; an output buffer that outputs read data read from the memory cell array to the memory controller; a DLL circuit that controls an operation timing of the output buffer; a power-down control circuit that suspends an operation of a predetermined internal circuit in response to issuance of a power-down command from the memory controller; and an external terminal to which a selection signal is input from the memory controller simultaneously with issuance of the power-down command, and wherein the power-down control circuit suspends an operation of the DLL circuit when the selection signal indicates a first state and continues an operation of the DLL circuit when the selection signal indicates a second state.

According to the present invention, by using a selection signal input to the semiconductor memory device simultaneously with issuance of a power-down command, selection as to whether to suspend an operation of a DLL circuit is made. That is, it is possible to select a fast exit mode and a slow exit mode on-the-fly. This makes it possible to appropriately select the fast exit mode or the slow exit mode depending on the current system status, and accordingly it becomes possible to reduce the power consumption while maintaining the performance of the entire system.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
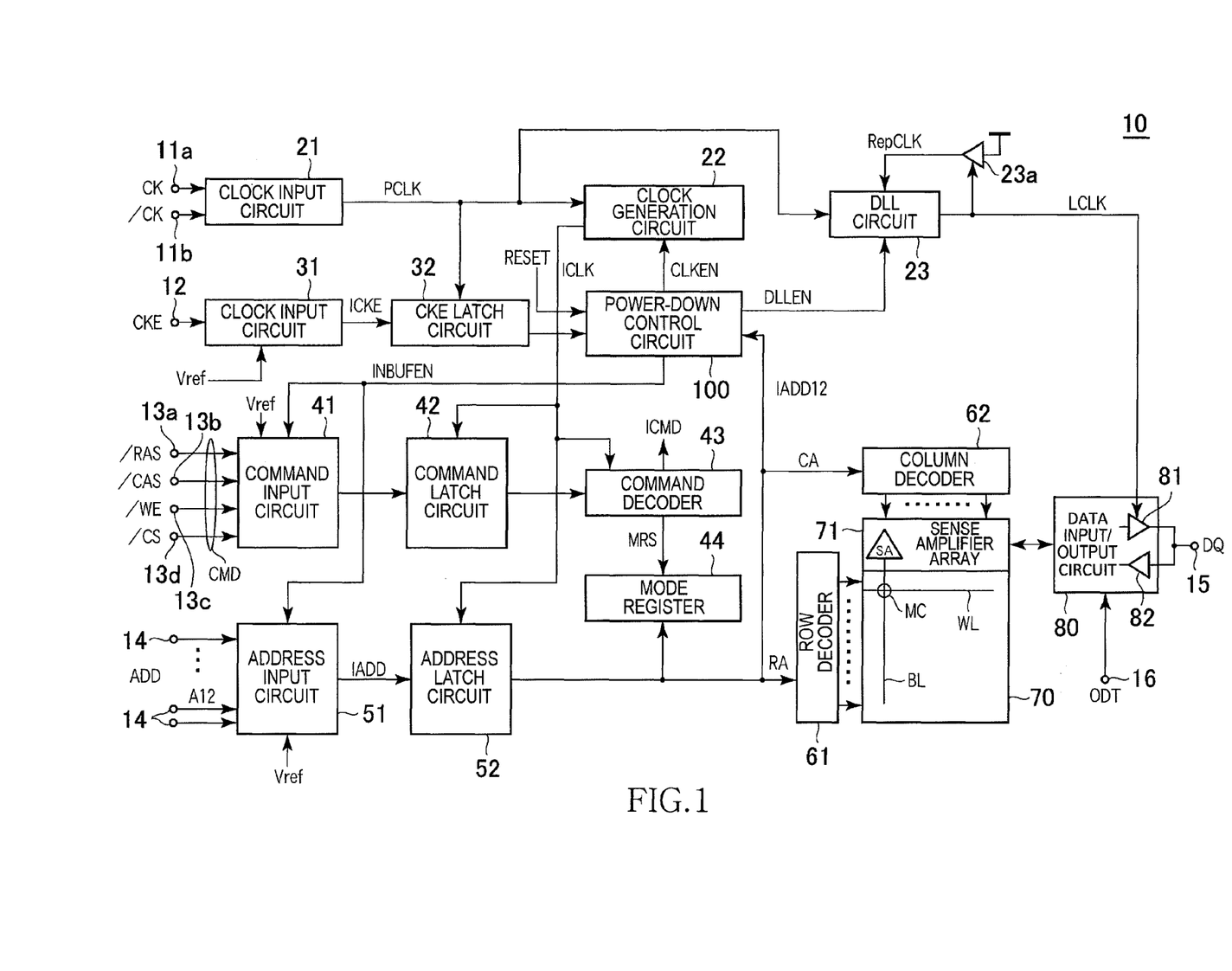
FIG. 1 is a block diagram showing a semiconductor memory device 10 according to an embodiment of the present invention.

FIG. 1 is a block diagram showing a semiconductor memory device 10 according to an embodiment of the present invention.

The semiconductor memory device 10 according to the present embodiment is a DDR3 synchronous DRAM, and includes, as its external terminals, clock terminals 11a and 11b, a clock enable terminal 12, command terminals 13a to 13d, address terminals 14, a data input/output terminal 15, and an on-die-termination terminal 16. The semiconductor memory device 10 also includes other components (not shown) such as a data strobe terminal and a power-supply terminal.

The clock terminals 11a and 11b are supplied with clock signals CK and /CK, respectively, and the supplied clock signals CK and /CK are then supplied to a clock input circuit 21. In the present specification, a signal denoted with "/" at the head of a signal name means an inverted signal of the corresponding signal. Therefore, the clock signals CK and /CK are mutually complementary. An internal clock PCLK, which is an output of the clock input circuit 21, is supplied to a clock generation circuit 22 and a DLL circuit 23.

The clock generation circuit 22 generates an internal clock ICLK. The DLL circuit 23 generates an output clock LCLK, and functions to supply the generated clock to a data input/output circuit 80.

The output clock LCLK generated by the DLL circuit 23 is a signal that is phase-controlled for the clock signals CK and /CK, and the phase of read data DQ is slightly advanced from the phase of the clock signals CK and /CK, so that the phase of read data DQ matches with that of the clock signals CK and /CK. To explain more specific, the output clock LCLK is supplied to a replica buffer 23a, and the phase of the output clock LCLK is controlled so that the phase of a replica clock RepCLK, which is an output of the replica buffer 23a, matches with that of the internal clock PCLK. The replica buffer 23a is a replica circuit of an output buffer 81 included in the data input/output circuit 80, and due to the presence of the replica buffer 23a, the phase of the read data DQ is accurately synchronized with that of the clock signals CK and /CK.

The clock enable terminal 12 is a terminal supplied with a clock enable signal CKE. The clock enable signal CKE indicates whether the clock signals CK and /CK are valid or invalid. When the clock enable signal CKE is at a high level, the clock signals CK and /CK become valid. On the other hand, when the clock enable signal CKE is at a low level, the clock signals CK and /CK become invalid. When the clock enable signal CKE is changed from the high level to the low level, the semiconductor memory device 10 enters in a precharge power-down mode based on a command signal. Further, when the clock enable signal CKE is changed from the low level to the high level after entering in the precharge power-down mode, the semiconductor memory device 10 exits from the precharge power-down mode based on a command signal.

The clock enable signal CKE is input to a CKE input circuit 31. The CKE input circuit 31 compares the clock enable signal CKE with a reference potential Vref to generate an internal-clock enable signal ICKE. The generated internal-clock enable signal ICKE is latched to a CKE latch circuit 32. The CKE latch circuit 32 synchronizes with the internal clock PCLK to latch the internal-clock enable signal ICKE. The latched internal-clock enable signal ICKE is supplied to a power-down control circuit 100. The power-down control circuit 100 is explained later in detail.

The command terminals 13a to 13d are respectively supplied with a row-address strobe signal /RAS, a column address strobe signal /CAS, a write enable signal /WE, and a chip select signal /CS. In the present specification, these signals are collectively called "command signals CMD" in some cases. These command signals CMD are supplied to a command input circuit 41. The command input circuit 41 compares the command signals CMD with the reference potential Vref to generate an internal command signal, and supplies the generated signal to a command latch circuit 42.

The command latch circuit 42 synchronizes with the internal clock ICLK to latch the command signals CMD. The command signals latched to the command latch circuit 42 are supplied to a command decoder 43.

The command decoder 43 is a circuit that synchronizes with the internal clock ICLK and generates various internal commands ICMD by performing decoding, counting or the like on the command signals CMD. The generated internal commands ICMD are supplied to various internal circuits (not shown). Among the internal commands ICMD, a mode register set (MRS) command is supplied to a mode register 44. An operation mode of the semiconductor memory device 10 is set to the mode register 44.

The address terminals 14 are terminals supplied with an address signal ADD, and the supplied address signal ADD is supplied to an address input circuit 51. The address input circuit 51 compares each bit of the supplied address signal ADD with the reference potential Vref to generate internal address signals IADD, and supplies the generated signal to an address latch circuit 52.

The address latch circuit 52 is a circuit that synchronizes with the internal clock ICLK to latch the internal address signals IADD. Among the internal address signals IADD latched to the address latch circuit 52, a row address RA is supplied to a row decoder 61 and a column address CA is supplied to a column decoder 62. When the circuit enters in the mode register set, the internal address signals IADD are supplied to the mode register 44. Among the internal address signals IADD, a 12th bit IADD12 is used as a selection signal in the precharge power-down mode, and it is supplied to the power-down control circuit 100.

The row decoder 61 is a circuit that selects any one of word lines WL included in a memory cell array 70. In the memory cell array 70, a plurality of word lines WL and a plurality of bit lines BL cross each other, and memory cells MC are located at the crossed intersections. In FIG. 1, only one word line WL, one bit line BL, and one memory cell MC are shown. Each bit lines BL is connected to a corresponding sense amplifier SA included in a sense amplifier array 71. As to which sense amplifier SA is selected is controlled by the column decoder 62.

The sense amplifier SA selected by the column decoder 62 is connected to the data input/output circuit 80. The data input/output circuit 80 includes the output buffer 81 and an input buffer 82 connected to the data input/output terminal 15. With this configuration, at a read operation, the read data DQ read from the memory cell array 70 is output via the output buffer 81 to the data input/output terminal 15. At a write operation, the write data DQ input to the data input/output terminal 15 is written in the memory cell array 70 via the input buffer 82.

To the output buffer 81 included in the data input/output circuit 80, the output clock LCLK is supplied. With this configuration, the phase of the read data DQ output via the data input/output terminal 15 is controlled to accurately match with the phase of the clock signals CK and /CK.

The on-die-termination terminal 16 is a terminal having an on-die-termination signal ODT input from outside. When the on-die-termination signal ODT is at a high level, the output buffer 81 functions as a terminating resistor, and this configuration improves the signal quality of the read data DQ output from the semiconductor memory devices of other Ranks to which the data input/output terminal 15 is commonly connected. Therefore, to perform the ODT operation that is accurately synchronized with the read operation, it is necessary to use the output clock LCLK also at the ODT operation. Accordingly, when an operation of the DLL circuit 23 is suspended, the ODT operation is in a non-synchronization mode, and its access speed needs to be reduced.

The power-down control circuit 100 is explained next.

As shown in FIG. 1, the internal-clock enable signal ICKE latched by the CKE latch circuit 32, the 12th bit IADD12 of the internal address signal IADD, and a reset signal RESET are supplied to the power-down control circuit 100. Based on these signals, the power-down control circuit 100 generates a clock activation signal CLKEN, an input activation signal INBUFEN, and a DLL activation signal DLLEN.

The clock activation signal CLKEN is a signal supplied to the clock generation circuit 22. The clock generation circuit 22 is activated when the clock activation signal CLKEN is at a high level and generates the internal clock ICLK. On the other hand, when the clock activation signal CLKEN is at a low level, an operation of the clock generation circuit 22 is suspended, and thus the internal clock ICLK is not generated.

When the internal clock ICLK is suspended, latch operations of the command latch circuit 42 and the address latch circuit 52 are also suspended, and accordingly the amount of current consumption in these circuits becomes substantially zero. As described later, when switching the fast exit mode and the slow exit mode during a precharge power down is enabled, it is necessary that the 12th bit IADD12 of the address signal IADD is configured to be latched in the address latch circuit 52 even when the internal clock ICLK is in a suspended state, or the 12th bit IADD12 is configured to pass through the address latch circuit 52 when the internal clock ICLK is suspended. In the present invention, it is not necessary to make it possible to switch the fast exit mode and the slow exit mode during the precharge power down.

The input activation signal INBUFEN is a signal supplied to the command input circuit 41 and the address input circuit 51. The command input circuit 41 and the address input circuit 51 are activated when the input activation signal INBUFEN is at a high level, and respectively generate an internal command and an internal address. On the other hand, when the input activation signal INBUFEN is at a low level, operations of the command input circuit 41 and the address input circuit 51 are suspended, and thus the internal command and the internal address are not generated. Accordingly, when the input activation signal INBUFEN is at a low level, the amount of current consumption in the command input circuit 41 and the address input circuit 51 becomes substantially zero. When switching the fast exit mode and the slow exit mode during the precharge power down is enabled, it is necessary that the 12th bit A12 of the address signal ADD can be received also during the precharge power down. More specifically, it is necessary to configure the address input circuit 51 so that, even when the input activation signal INBUFEN is at a low level, the internal address IADD12 is generated.

The DLL activation signal DLLEN is a signal supplied to the DLL circuit 23. The DLL circuit 23 is activated when the DLL activation signal DLLEN is at a high level, and generates the output clock LCLK. On the other hand, when the DLL activation signal DLLEN is at a low level, the operation of the DLL circuit 23 is suspended, and accordingly the output clock LCLK is not generated any more. Accordingly, when the DLL activation signal DLLEN is at a low level, the amount of current consumption by the DLL circuit 23 becomes substantially zero. When the operation is resumed after suspending the DLL circuit 23, a certain period of time (a lock time) is required before the output clock LCLK that is correctly phase-controlled is output.

Figure 2:
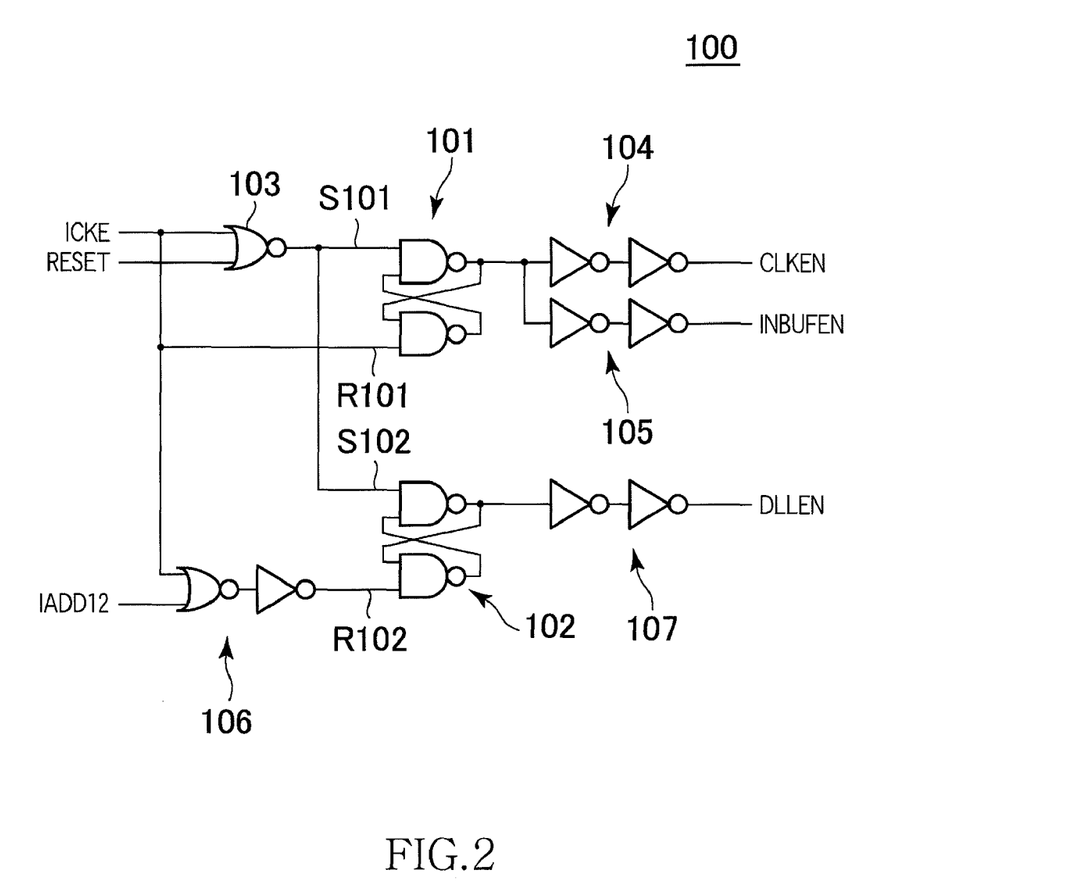
FIG. 2 is a circuit diagram of the power-down control circuit 100.

FIG. 2 is a circuit diagram of the power-down control circuit 100.

As shown in FIG. 2, the power-down control circuit 100 includes two SR latch circuits 101 and 102. To a set terminal S101 of the SR latch circuit 101, an output of a NOR circuit 103 is supplied, and to a reset terminal R101 thereof, the internal-clock enable signal ICKE is supplied. In the NOR circuit 103, the internal-clock enable signal ICKE and the reset signal RESET are input. The reset signal RESET is maintained at a low level in a normal operation. An output of the SR latch circuit 101 is output as the clock activation signal CLKEN via a buffer circuit 104, and is output at the same time as the input activation signal INBUFEN via a buffer circuit 105.

On the other hand, an output of the NOR circuit 103 is supplied to a set terminal S102 of the SR latch circuit 102, and an output of the OR circuit 106 is supplied to a reset terminal R102. The internal-clock enable signal ICKE and the 12th bit IADD12 of the internal address signal IADD are input to the OR circuit 106. An output of the SR latch circuit 102 is output as the DLL activation signal DLLEN via a buffer circuit 107.

With such a configuration, when the reset signal RESET is at a low level, logical levels of the clock activation signal CLKEN and the input activation signal INBUFEN match with a logical level of the internal-clock enable signal ICKE. Therefore, when the internal-clock enable signal ICKE is changed to a low level, operations of the input circuits 41 and 51 and the latch circuits 42 and 52 are suspended, and the circuits enter in the power-down mode. This stops input of signals other than the clock signals CK and /CK, the clock enable signal CKE, and the on-die-termination signal ODT. As a result, the current consumption is reduced.

Meanwhile, a logical level of the DLL activation signal DLLEN at the power-down mode is determined by the 12th bit IADD12 of the internal address signal IADD. That is, when the internal-clock enable signal ICKE is at a low level, the logical level of the DLL activation signal DLLEN matches with that of the 12th bit IADD12 of the internal address signal IADD. Accordingly, when the bit IADD12 is at a low level at entry to the power-down mode, the operation of the DLL circuit 23 is suspended. That is, the mode becomes the slow exit mode. On the other hand, when the bit IADD12 is at a high level at entry to the power-down mode, the operation of the DLL circuit 23 is continued. That is, the mode becomes the fast exit mode.

As described above, according to the semiconductor memory device 10 of the present embodiment, when entering in the power-down mode, it is possible to select either the slow exit mode or the fast exit mode by using the IADD12 as a selection signal. That is, it is possible to select the modes independently at each entry to the power-down mode without changing the set value of the mode register 44.

Figure 3:
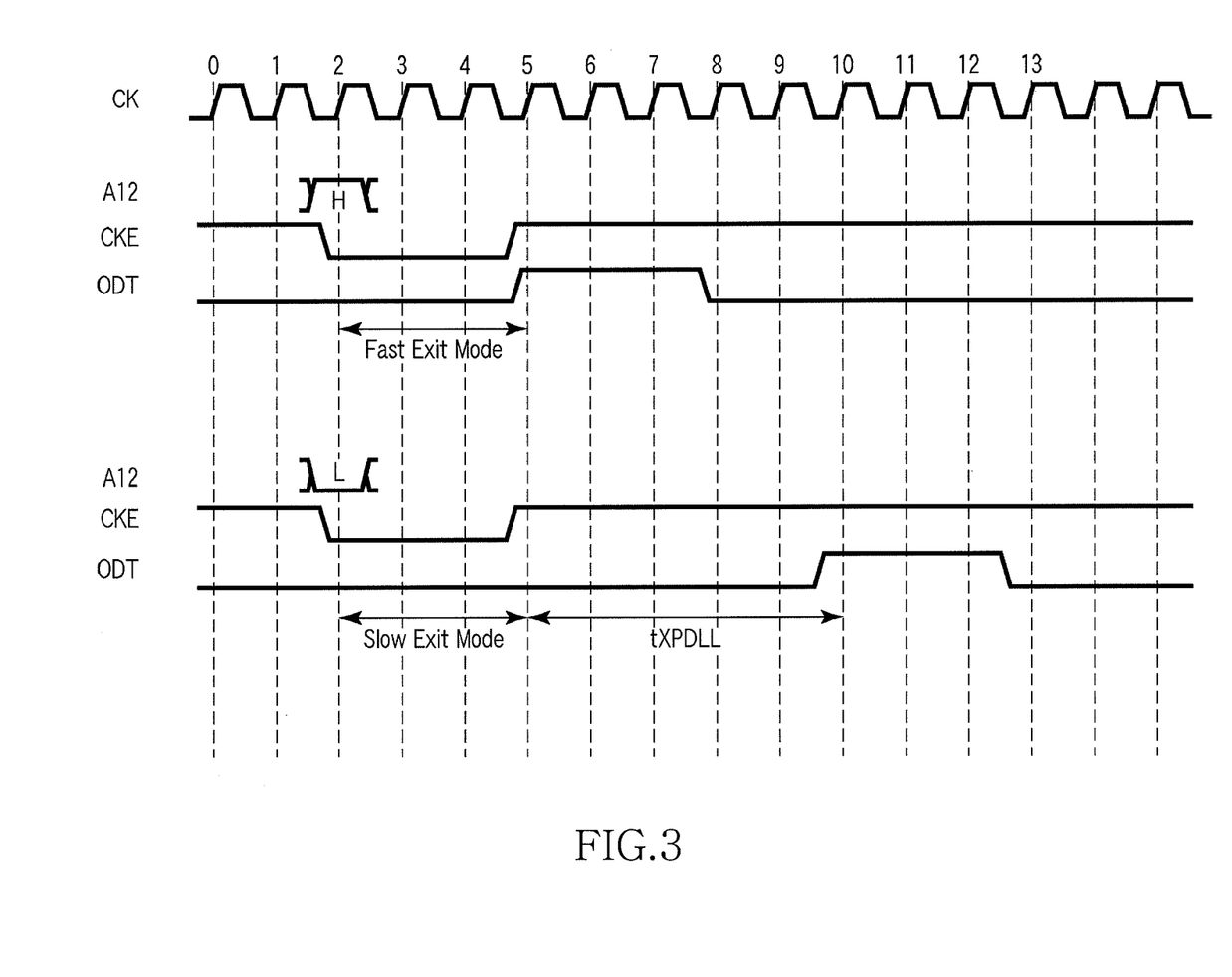
FIG. 3 is a timing chart showing an operation of the semiconductor memory device 10 according to the present embodiment.

FIG. 3 is a timing chart showing an operation of the semiconductor memory device 10 according to the present embodiment.

As shown in FIG. 3, when selecting the fast exit mode in the precharge power-down mode, the clock enable signal CKE is changed from a high level to a low level. At the same time, the 12th bit A12 (a selection signal) of the address signal ADD is changed to the high level. In the example shown in FIG. 3, these signals are input in synchronization with an active edge #2 of the clock signal CK. Therefore, the fast exit mode is selected, and the operation of the DLL circuit 23 is continued. In the example shown in FIG. 3, the clock enable signal CKE is changed to a high level in synchronization with an active edge #5 of the clock signal CK. As a result, the semiconductor memory device 10 exits from the power-down mode. During this process, the operation of the DLL circuit 23 is continued and thus it is possible to immediately input the on-die-termination signal ODT.

Meanwhile, when selecting the slow exit mode in the precharge power-down mode, the clock enable signal CKE is changed from a high level to a low level, and at the same time, the 12th bit A12 (a selection signal) of the address signal ADD is changed to a low level. In the example shown in FIG. 3, these signals are input in synchronization with the active edge #2 of the clock signal CK. Therefore, the slow exit mode is selected, and thus the operation of the DLL circuit 23 is suspended. Further, in the example shown in FIG. 3, the clock enable signal CKE is changed to a high level in synchronization with the active edge #5 of the clock signal CK. As a result, the semiconductor memory device 10 exits from the power-down mode. The operation of the DLL circuit 23 is resumed in response thereto; however, a predetermined time (tXPDDL) is required until the DLL circuit 23 is locked. Accordingly, the ODT operation in the synchronization mode cannot be operated until the predetermined time (tXPDDL) is elapsed.

Figure 4:
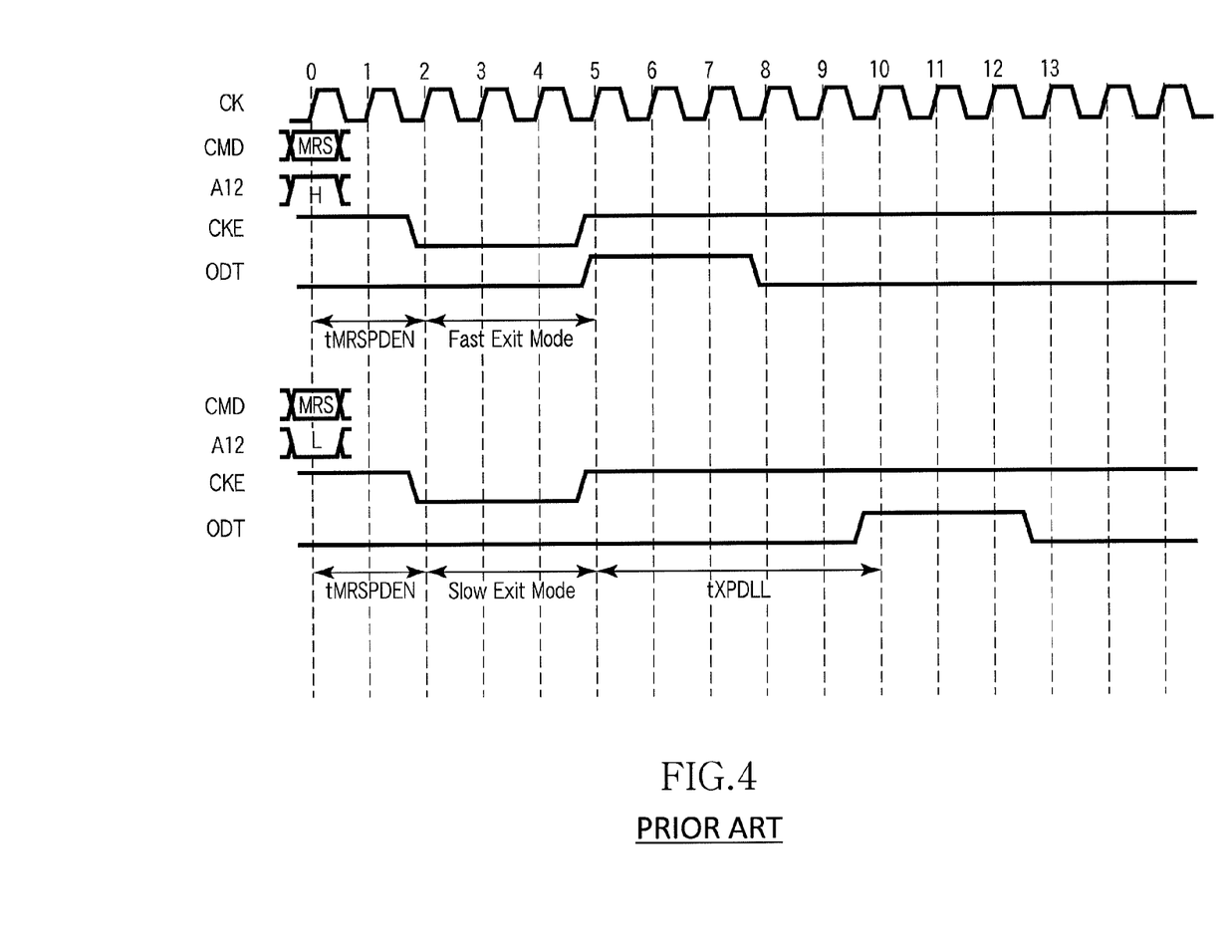
FIG. 4 is a timing chart showing an operation of a conventional semiconductor memory device.

FIG. 4 is a timing chart showing an operation of a conventional semiconductor memory device.

As shown in FIG. 4, also in the conventional semiconductor memory device, it is possible to enter in the precharge power-down mode by changing the clock enable signal CKE from a high level to a low level. However, whether to select the fast exit mode or the slow exit mode is determined by a set value of the mode register 44. Therefore, to change the modes, the mode-register set command needs to be executed in advance. In an example shown in FIG. 4, the mode-register set command is issued in synchronization with an active edge #0 of the clock signal CK. To input a subsequent command after executing the mode-register set command, it has to wait for a predetermined time (tMRSPDEN). Accordingly, in this conventional semiconductor memory device, each time the fast exit mode and the slow exit mode are switched, an overhead as much as the predetermined time (tMRSPDEN) is generated. On the other hand, in the semiconductor memory device 10 according to the present embodiment, it is possible to select either the fast exit mode or the slow exit mode on-the-fly without generating such an overhead.

Figure 5:
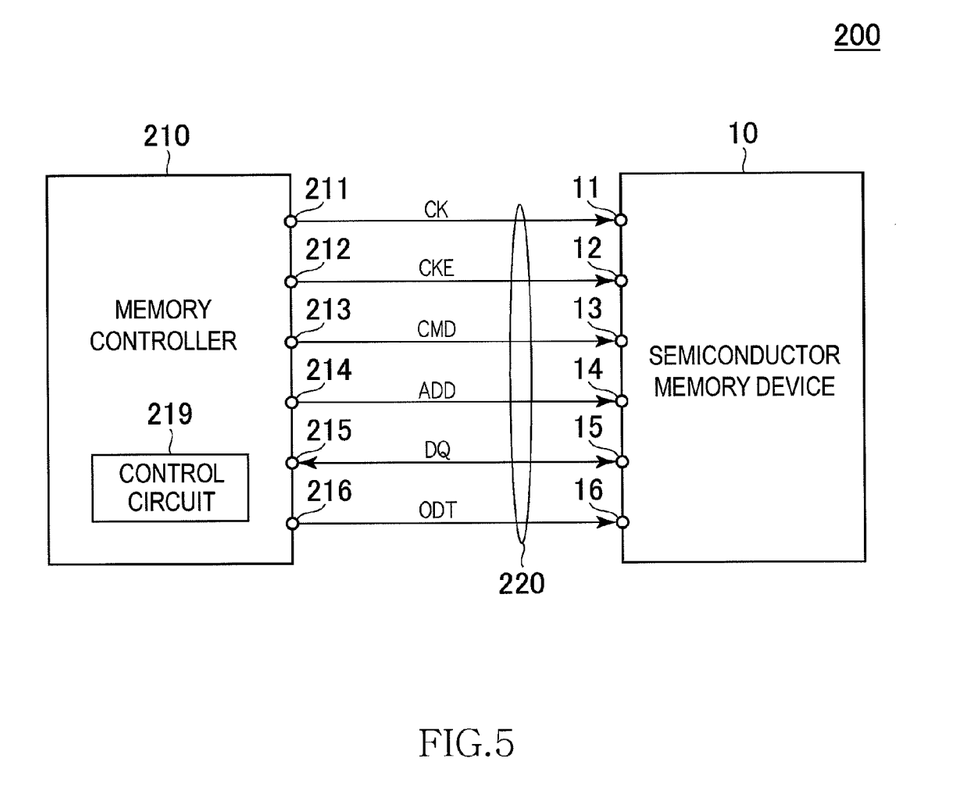
FIG. 5 is a block diagram of a data processing system 200 using the semiconductor memory device 10.

FIG. 5 is a block diagram of a data processing system 200 using the semiconductor memory device 10.

The data processing system 200 shown in FIG. 5 is configured by the semiconductor memory device 10 shown in FIG. 1 and a memory controller 210 connected thereto. The memory controller 210 includes a clock terminal 211 that outputs the clock signals CK and /CK, a clock enable terminal 212 that outputs the clock enable signal CKE, a command terminal 213 that outputs the command signal CMD, an address terminal 214 that outputs the address signal ADD, a data input/output terminal 215 that inputs the read data DQ and outputs the write data DQ, and an on-die-termination terminal 216. Terminals other than these terminals are not shown in FIG. 5. These terminals are connected to the corresponding terminals 11 to 16 of the semiconductor memory device 10 via a bus 220.

The memory controller 210 further includes a control circuit 219 that performs power-down control on the semiconductor memory device 10. When the control circuit 219 selects the slow exit mode at the time of performing precharge power down on the semiconductor memory device 10, the control circuit 219 changes the clock enable signal CKE output from the clock enable terminal 212 to a low level, and at the same time, sets the 12th bit A12 of the address signal ADD output from the address terminal 214 to a low level. On the other hand, when the control circuit 219 selects the fast exit mode at the time of performing precharge power down on the semiconductor memory device 10, the control circuit 219 changes the clock enable signal CKE to a low level, and at the same time, sets the 12th bit A12 of the address signal ADD to a high level.

In this manner, it becomes possible to select the fast exit mode and the slow exit mode on-the-fly without issuing any mode-register set command.

Figure 6:
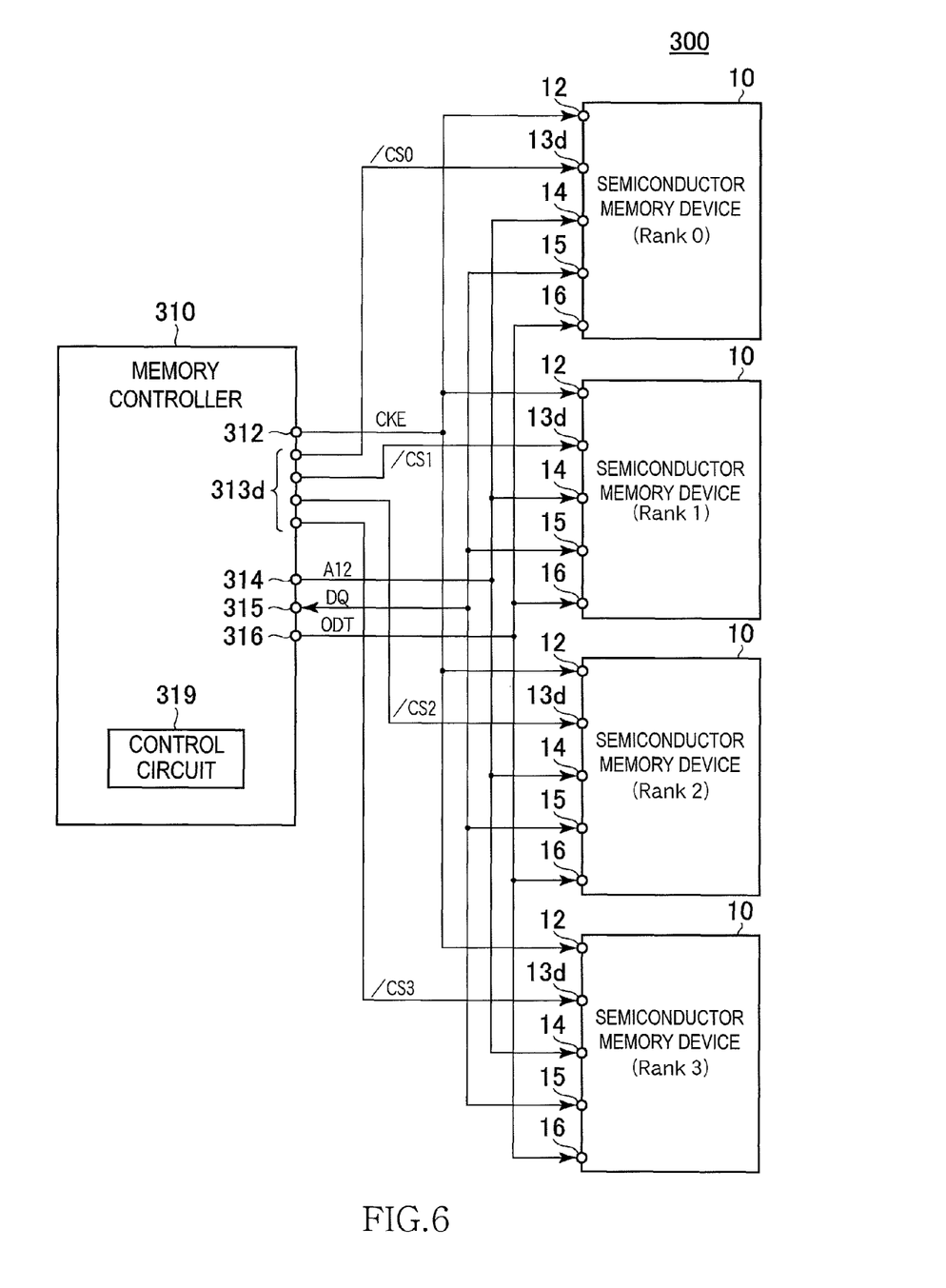
FIG. 6 is a block diagram of a data processing system 300 having a plurality of Ranks.

FIG. 6 is a block diagram of a data processing system 300 having a plurality of Ranks.

The data processing system 300 shown in FIG. 6 is configured by four semiconductor memory devices 10 and a memory controller 310 connected thereto. These four semiconductor memory devices 10 belong to Rank0 to Rank3, which are different to one another. Each of the Ranks is exclusively accessed. These Ranks are selected by chip select signals /CS0 to /CS3, and any one of the Ranks is activated.

Other signals are used commonly among the Ranks. Therefore, for example, the data input/output terminals 15 of the Rank0 to Rank3 are commonly connected to a data input/output terminal 315 of the memory controller 310. The same applies to the clock enable terminal 12, the address terminals 14, and the on-die-termination terminal 16.

In the data processing system 300, entry to the precharge power-down mode can be made at each of the Ranks. For example, when precharge power down is performed on the semiconductor memory device 10 of the Rank0, it suffices that the clock enable signal CKE is changed from a high level to a low level in a state that the chip select signal /CS0 is at a low level and the other chip select signals /CS1 to /CS3 are at a high level. Of course, the fast exit mode and the slow exit mode are selected by using the 12th bit A12 of the address signal ADD.

In this case, when the predetermined semiconductor memory device 10 (for example, the Rank0) is in the power-down mode, if all of the remaining semiconductor memory devices (for example, the Rank1 to Rank3) are in the power-down mode, it is preferable to select the slow exit mode. The reason for this is that when all of the Ranks enter in the power-down mode, the ODT operation does not need to be performed at the power down, and thus it is preferable to select the slow exit mode, in which current consumption is smaller.

On the other hand, when the predetermined semiconductor memory device 10 (for example, the Rank0) enters in the power-down mode, if at least one of the remaining semiconductor memory devices 10 (for example, the Rank1 to Rank3) is not in the power-down mode, it is preferable to select the fast exit mode. The reason for this is that when there is a corresponding Rank that is not in the power-down mode, the semiconductor memory device 10 of a Rank that is in a power down state needs to perform the ODT operation in synchronization with an access to the corresponding Rank.

Such a selection is performed by a control circuit 319 included in the memory controller 310. An operation of the control circuit 319 is explained below with reference to the flowchart of FIG. 7.

Figure 7:
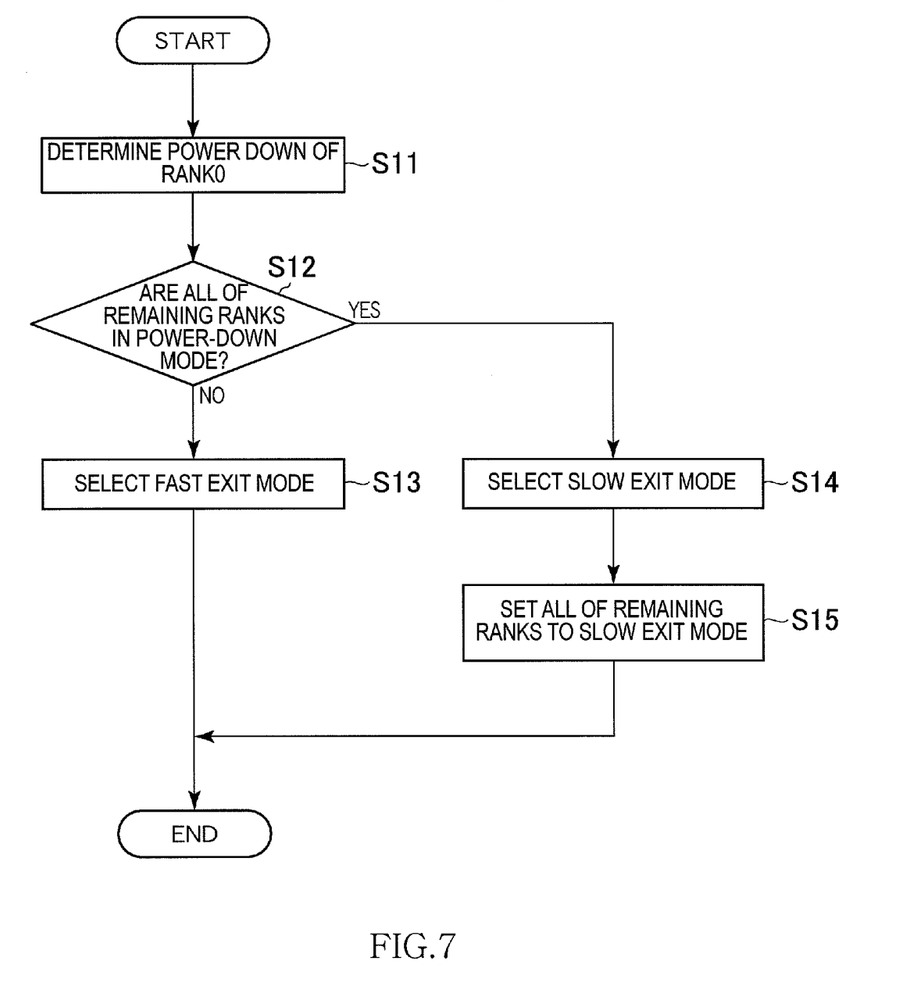
FIG. 7 is a flowchart for explaining an operation when the semiconductor memory device 10 of the Rank0 is in the power-down mode.

FIG. 7 is a flowchart for explaining an operation when the semiconductor memory device 10 of the Rank0 is in the power-down mode.

As shown in FIG. 7, when it is determined that the semiconductor memory device 10 of the Rank0 is entered in the power-down mode (step S11), the control circuit 319 determines whether all of the remaining Rank1 to Rank3 are in the power-down mode (step S12). As a result of the determination, when at least one of the remaining Rank1 to Rank3 is not in the power-down mode (step S12: NO), the fast exit mode is selected (step S13). More specifically, the clock enable signal CKE is changed to a low level in a state that the Rank0 is selected by the chip select signal /CS0, and at the same time, the 12th bit A12 of the address signal ADD is set to a high level.

On the other hand, when all of the remaining Rank1 to Rank3 are in the power-down mode (step S12: YES), the slow exit mode is selected (step S14). More specifically, the clock enable signal CKE is changed to a low level in a state that the Rank0 is selected by the chip select signal /, and at the same time, the 12 th bit A12 of the address signal ADD is set to a low level.

Furthermore, all of the remaining Rank1 to Rank3 that are already in the power-down mode are switched to the slow exit mode (step S15). More specifically, in a state that the remaining Rank1 to Rank3 are selected by the chip select signals /CS1 to /CS3, the 12th bit A12 of the address signal ADD is changed to a low level. As a result, all of the Rank0 to Rank3 are set to the slow exit mode. Consequently, the power consumption in the entire system is reduced. The reason why all of the remaining Rank1 to Rank3 are switched to the slow exit mode at step S15 is that, when all of the Rank0 to Rank3 are changed to the power-down mode, it is no longer necessary to perform the ODT operation. However, this is not always the case if it is necessary to return from the precharge power-down mode at a high speed. Further, to enable the execution performed at step S15, it is necessary that the 12th bit A12 of the address signal ADD can be input during the precharge power down. To achieve this, as described above, it is necessary to configure that, even when the input activation signal INBUFEN is at a low level, the internal address IADD12 can be generated in the address input circuit 51. In addition, even when the internal clock ICLK is stopped, it is necessary to configure that the internal address IADD12 can be latched in the address latch circuit 52. Alternatively, it is necessary to configure that the internal address IADD12 passes through the address latch circuit 52.

Figure 8:
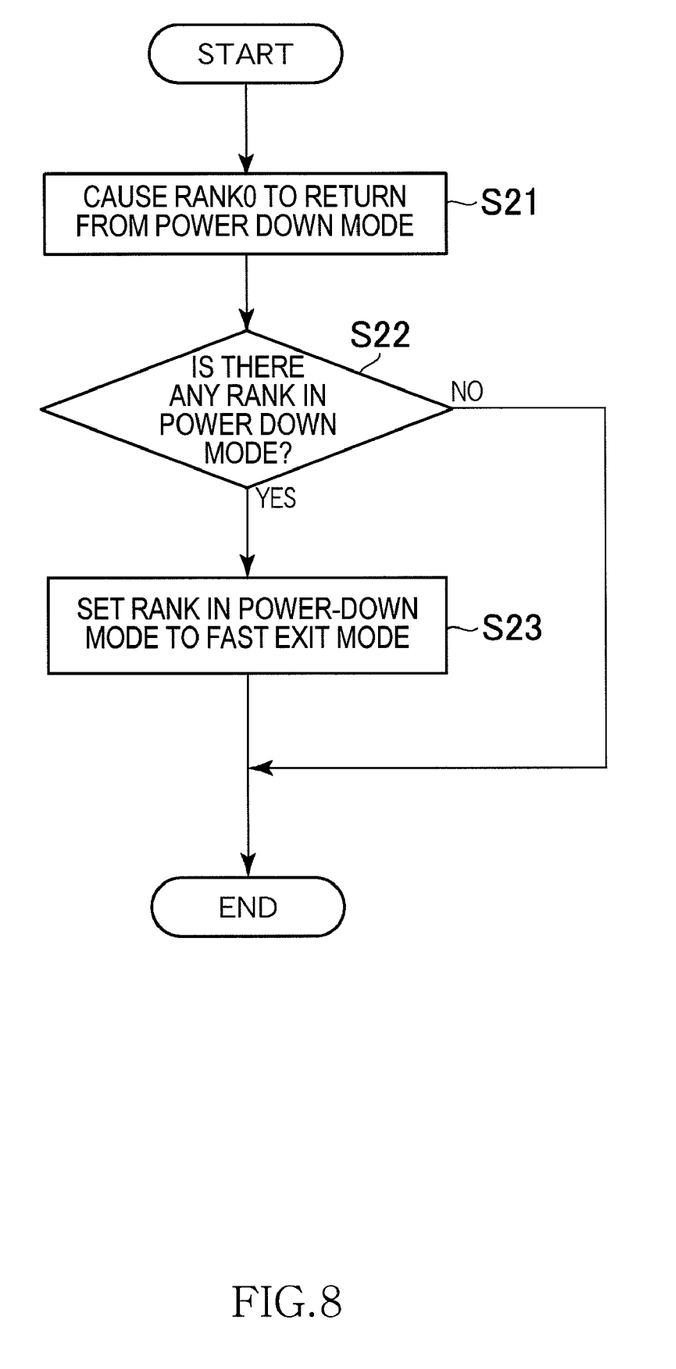
FIG. 8 is a flowchart for explaining an operation performed when the semiconductor memory device 10 of the Rank0 is caused to exit from the power-down mode.

FIG. 8 is a flowchart for explaining an operation performed when the semiconductor memory device 10 of the Rank0 is caused to exit from the power-down mode.

The flowchart shown in FIG. 8 represents an operation preferably performed when the 12th bit A12 of the address signal ADD can be input during the precharge power down. Therefore, when the address signal ADD cannot be input during the precharge power down, it is not possible to perform the operation shown in FIG. 8.

As shown in FIG. 8, after the semiconductor memory device 10 of the Rank0 is caused to exit from the power-down mode (step S21), the control circuit 319 determines whether at least one of the remaining Rank1 to Rank3 is in the power-down mode (step S22). As a result of determination, when none of these Ranks is in the power-down mode (step S22: NO), the process is finished.

On the other hand, when at least one of the remaining Rank1 to Rank3 is in the power-down mode (step S22: YES), all of the Ranks in the power-down mode are switched to the fast exit mode (step S23). More specifically, in a state that the Rank1 to Rank3 in the power-down mode are selected by the chip select signals /CS1 to /CS3, the 12th bit A12 of the address signal ADD is changed to a high level. In this manner, the Rank0 to Rank3 in the power-down mode are set to the fast exit mode. Accordingly, a high-speed ODT operation is enabled. The reason why the Rank1 to Rank3 in the power-down mode are switched to the fast exit mode at step S23 is that, once any one of the Ranks exits from the power-down mode, it becomes necessary to perform the ODT operation. However, this is not always the case when there is a need to suppress the power consumption in the entire system.

As described above, according to the semiconductor memory device 10 of the present embodiment, at the entry to the precharge power-down mode, it is possible to select the fast exit mode and the slow exit mode on-the-fly, and accordingly it is possible to reduce the power consumption while maintaining the performance of the entire system.

It is apparent that the present invention is not limited to the above embodiments, but may be modified and changed without departing from the scope and spirit of the invention.

For example, in the above embodiment, an example in which the fast exit mode and the slow exit mode are selected on-the-fly in the precharge power-down mode is described. However, the target of the present invention is not limited to the precharge power-down mode, and can be applied to other power-down modes.

Also in the above embodiment, the 12th bit A12 of the address signal ADD is used as a selection signal; however, the selection signal used for selecting the fast exit mode and the slow exit mode is not limited to the 12th bit A12 of the address signal ADD. Therefore, other bits of the address signal ADD can be also used, and a signal other than the address signal ADD can be also used. In addition, it is not essential that the selection signal is one bit, and a combination of signals of two or more bits can be also used.

Furthermore, in the above embodiment, entry to and exit from the power-down mode are performed based on the logical level of the clock enable signal CKE. However, these operations can be also performed by using a signal other than the clock enable signal CKE.

The target of the present invention is not limited to a DDR3 synchronous DRAM, and the invention can be also applied to other types of semiconductor devices such as a PRAM.

What is claimed is:

1. A semiconductor memory device comprising:
   a memory cell array that includes a plurality of memory cells;
   an output buffer that outputs read data read from the memory cell array to outside;
   a DLL circuit controlling an operation timing of the output buffer;
   a command input circuit receiving command signals; and
   a power-down control circuit that suspends the receiving operation of the command input circuit in response to issuance of a first signal, suspends the controlling operation of the DLL circuit in response to issuance of the first signal and a first state of a second signal, and continues the controlling operation of the DLL circuit in response to issuance of the first signal and a second state of the second signal, wherein
   the first and second signals are issued independently of any command signal received to the command input circuit.

2. The semiconductor memory device as claimed in claim 1, wherein
   the second signal is a 1-bit signal, and
   the power-down control circuit suspends the controlling operation of the DLL circuit when the second signal is at a first logical level, and continues the controlling operation of the DLL circuit when the second signal is at a second logical level.

3. The semiconductor memory device as claimed in claim 2, wherein the second signal is one of a plurality of address signals.

4. The semiconductor memory device as claimed in claim 1, further comprising an address input circuit that receives a plurality of address signals supplied from outside, wherein the second signal is one of the plurality of address signals.

5. The semiconductor memory device as claimed in claim 1, further comprising a clock enable terminal provided separately from a plurality of command terminals to which the command signals are supplied, wherein
   the first signal is represented by a logical level of a clock enable signal supplied to the clock enable terminal.

6. The semiconductor memory device as claimed in claim 1, wherein the power-down control circuit suspends the DLL circuit in operation or operates the DLL circuit in a suspended state while maintaining suspension of the receiving operation of the command input circuit when the second signal is changed during the receiving operation of the command input circuit being suspended by the first signal.

7. A memory controller that controls a semiconductor memory device capable of entering in a power-down mode, the memory controller comprising:
   a first output terminal that outputs a power-down command that causes the semiconductor memory device to enter in the power-down mode;
   a second output terminal that outputs a selection signal;
   a third output terminal that outputs command signals; and
   a control circuit that changes the selection signal to a first state simultaneously with an output of the power-down command when a DLL circuit included in the semiconductor memory device is suspended in the power-down mode, and changes the selection signal to a second state simultaneously with an output of the power-down command when the DLL circuit is operated in the power-down mode, wherein
   the control circuit changes the selection signal to the first state or to the second state independently of any command signal outputted from the third output terminal.

8. The memory controller as claimed in claim 7, wherein the second output terminal is one of a plurality of address terminals that output an address signal.

9. The memory controller as claimed in claim 7, wherein the control circuit changes the selection signal in a state that the semiconductor memory device is in the power-down mode by issuance of the power-down command, so as to suspend the DLL circuit in operation or to operate the DLL circuit in a suspended state.

10. The memory controller as claimed in claim 7, further comprising a data input/output terminal commonly connected to a plurality of semiconductor memory devices, wherein
    when the control circuit brings a predetermined semiconductor memory device among the semiconductor memory devices into the power-down mode, if all of remaining semiconductor memory devices are in the power-down mode, the control circuit supplies the selection signal in the first state to the predetermined semiconductor memory device, and if at least one of the remaining semiconductor memory devices is not in the power-down mode, the control circuit supplies the selection signal in the second state to the predetermined semiconductor memory device.

11. The memory controller as claimed in claim 10, wherein when the control circuit brings the predetermined semiconductor memory device among the semiconductor memory devices into the power-down mode, if all of remaining semiconductor memory devices are in the power-down mode, the control circuit supplies the selection signal in the first state to not only the predetermined semiconductor memory device but also the remaining semiconductor memory devices.

12. An information processing system comprising:
    a semiconductor memory device; and
    a memory controller that controls the semiconductor memory device, wherein
    the semiconductor memory device comprises:
    a memory cell array that includes a plurality of memory cells;
    an output buffer that outputs read data read from the memory cell array to the memory controller;
    a DLL circuit controlling an operation timing of the output buffer;
    a command input circuit receiving command signals from the memory controller; and
    a power-down control circuit that suspends the receiving operation of the command input circuit in response to issuance of a first signal from the memory controller, suspends the controlling operation of the DLL circuit in response to issuance of the first signal and a first state of a second signal from the memory controller, and continues the controlling operation of the DLL circuit in response to issuance of the first signal and a second state of the second signal from the memory controller, wherein the first and second signals are issued independently of any command signal received to the command input circuit from the memory controller.

13. The information processing system as claimed in claim 12, wherein the memory controller comprises:

a first output terminal that outputs the first signal that causes the semiconductor memory device to enter in a power-down mode;

a second output terminal that outputs the second signal; and a control circuit that changes the second signal to the first state simultaneously with an output of the first signal when the DLL circuit is suspended in the power-down mode, and changes the second signal to the second state simultaneously with an output of the first signal when the DLL circuit is operated at the power-down mode.

14. The semiconductor memory device as claimed in claim 1, further comprising a clock enable input circuit that receives a clock enable signal, wherein the first signal is represented by a low logical level of the clock enable signal.

15. The semiconductor memory device as claimed in claim 1, wherein the command signals supplied to the command input circuit consist of row address strobe (RAS) command signal, column address strobe (CAS) command signal, write enable (WE) command signal and chip select (CS) command signal.

16. The semiconductor memory device as claimed in claim 1, further comprising a command latch circuit latching the command signals supplied from the command input circuit, wherein the power-down control circuit suspends the latching operation of the command latch circuit in response to issuance of the first signal.

17. The semiconductor memory device as claimed in claim 4, wherein the power-down control circuit suspends the receiving operation of the address input circuit in response to issuance of the first signal.

18. The semiconductor memory device as claimed in claim 4, further comprising an address latch circuit latching the plurality of address signals supplied from the address input circuit, wherein the power-down control circuit suspends the latching operation of the address latch circuit in response to issuance of the first signal.

19. The semiconductor memory device as claimed in claim 1, further comprising a command decode circuit decoding the command signals to generate internal commands, wherein the power-down control circuit suspends the decoding operation of the command decode circuit in response to issuance of the first signal.

20. The semiconductor memory device as claimed in claim 19, wherein one of the internal commands is a mode register set command; and the first and second states of the second signal are varied independently of the mode register set command.

* * * * *